(12) United States Patent
Lei et al.

(10) Patent No.: US 8,932,887 B2
(45) Date of Patent: Jan. 13, 2015

(54) METHOD FOR MANUFACTURING LED WITH TRANSPARENT CERAMICS

(75) Inventors: Muyun Lei, Beijing (CN); Zhen Li, Beijing (CN); Zailiang Lou, Beijing (CN); Yanmin Zhao, Beijing (CN); Qinghai Song, Beijing (CN); Yongliang Yang, Beijing (CN)

(73) Assignee: Bright Crystals Technology, Inc., Beijing (CN)

( * ) Notice: Subject to any disclaimer, the term of this patent is extended or adjusted under 35 U.S.C. 154(b) by 20 days.

(21) Appl. No.: 13/497,824

(22) PCT Filed: Sep. 29, 2010

(86) PCT No.: PCT/CN2010/077458
§ 371 (c)(1),
(2), (4) Date: Mar. 23, 2012

(87) PCT Pub. No.: WO2011/038680
PCT Pub. Date: Apr. 7, 2011

(65) Prior Publication Data
US 2012/0178193 A1 Jul. 12, 2012

(30) Foreign Application Priority Data
Sep. 30, 2009 (CN) .......................... 2009 1 0235312

(51) Int. Cl.
*H01L 21/00* (2006.01)
*H01L 33/50* (2010.01)
(Continued)

(52) U.S. Cl.
CPC .............. *H01L 33/50* (2013.01); *C04B 35/443* (2013.01); *C04B 35/645* (2013.01); *C04B 35/6455* (2013.01); *C09K 11/02* (2013.01);
(Continued)

(58) Field of Classification Search
USPC .................................................... 257/E33.06
See application file for complete search history.

(56) References Cited

U.S. PATENT DOCUMENTS

| 2007/0018175 A1* | 1/2007 | Mazzochette et al. .......... 257/81 |
| 2008/0187746 A1* | 8/2008 | De Graaf et al. ............. 428/332 |

(Continued)

FOREIGN PATENT DOCUMENTS

| CN | 101501160 A | 8/2009 |
| CN | 101697367 A | 4/2010 |

(Continued)

*Primary Examiner* — Wensing Kuo
*Assistant Examiner* — Shaka White
(74) *Attorney, Agent, or Firm* — AKC Patents LLC; Aliki K. Collins

(57) ABSTRACT

A method for manufacturing an LED (light emitting diode) with transparent ceramic is provided, which includes: adding quantitative fluorescent powder into transparent ceramic powder, wherein the doped ratio of the fluorescent powder is 0.01-100 wt %; preparing the fluorescent transparent ceramic using ceramic apparatus and process, after fully mixing the raw material; assembling the prepared fluorescent transparent ceramic and a semiconductor chip to form the LED device. The method assembles the fluorescent transparent ceramic and a semiconductor chip to form the LED device by replacing the fluorescent powder layer and the epoxy resin package casting of the traditional LED with fluorescent transparent ceramic. The fluorescent transparent ceramic is used as the package cast and fluorescent material, and the LED device manufactured through the method has more excellent performance.

8 Claims, 1 Drawing Sheet

(51) Int. Cl.
*C04B 35/443* (2006.01)
*C04B 35/645* (2006.01)
*C09K 11/02* (2006.01)
*C09K 11/77* (2006.01)
*H01L 33/48* (2010.01)

(52) U.S. Cl.
CPC ..... *C09K11/7774* (2013.01); *C04B 2235/3222* (2013.01); *C04B 2235/3225* (2013.01); *C04B 2235/3229* (2013.01); *C04B 2235/6581* (2013.01); *C04B 2235/661* (2013.01); *C04B 2235/662* (2013.01); *C04B 2235/665* (2013.01); *C04B 2235/666* (2013.01); *C04B 2235/667* (2013.01); *C04B 2235/668* (2013.01); *C04B 2235/9653* (2013.01); *C04B 2235/9661* (2013.01); *H01L 33/48* (2013.01)

USPC .......... 438/26; 438/29; 438/34; 257/E33.061

(56) References Cited

U.S. PATENT DOCUMENTS

| 2008/0290785 | A1* | 11/2008 | Schmidt et al. | 313/501 |
| 2009/0072700 | A1* | 3/2009 | Kameshima et al. | 313/483 |
| 2009/0284948 | A1* | 11/2009 | Yamao et al. | 362/84 |
| 2010/0012964 | A1* | 1/2010 | Copic et al. | 257/98 |
| 2010/0051974 | A1* | 3/2010 | Krames | 257/89 |

FOREIGN PATENT DOCUMENTS

| CN | 102130274 A | * | 7/2011 |
| TW | 200916557 A | | 4/2009 |

* cited by examiner

US 8,932,887 B2

METHOD FOR MANUFACTURING LED WITH TRANSPARENT CERAMICS

TECHNICAL FIELD

The present invention relates to the LED field, in particular to a method for manufacturing an LED with transparent ceramic.

BACKGROUND ART

At present, the LED preparation technology used widely is to package an LED chip in blue light or ultraviolet light and the like with a fluorescent powder layer and an epoxy resin housing, and by adjusting the type of the chips, as well as the components and the proportion of fluorescent powders, red, orange, yellow, green, blue and other multi-color light and white light can be emitted.

In terms of the prior art, the composition and the structure of an LED have some key problems which need to be solved urgently.

Currently, the vast majority of LED packaging materials is epoxy resin or organic silicon. The application form of the fluorescent powder in the LED is mainly as follows: the fluorescent powder and the epoxy resin or the organic silicon as a matrix are stirred and mixed under liquid state, and then the mixture is coated on the surface of the LED chip. The housing made of epoxy resin or organic silicon material is finally applied for packaging.

There are some problems in the above-mentioned application method of the fluorescent powder and the packaging material:

(1) As the fluorescent powder and silica gel are physically mixed under liquid state, the fluorescent powder will settle inevitably; furthermore, the larger the particle size of the fluorescent powder is, the more obvious the settlement becomes.
(2) With the rise in the temperature of an element during the using process, yellowing is easy to occur because the softening point of the epoxy resin is very low (55-95) and the heat conductivity thereof is poor, as a result, the transparency is affected and the performances and the service life of the LED are further reduced.
(3) As the fluorescent powder is directly settled on the surface of the LED chip, back scattering of light can be generated during the light-emitting process, light loss (20%-30%) is further caused, the stability in the performances of the LED is affected and the service life of the LED is further shortened.
(4) The refractive index of each of the epoxy resin material and the organic silicon material is less than 1.5 generally, which is greatly different from the refractive index of the LED chip (the refractive index is 2-4), thus total reflection is liable to occur and the brightness of the LED is further seriously affected; furthermore, the price of the organic silicon is high.

In order to solve the above-mentioned technical problems, one way is to mix the fluorescent powder with the epoxy resin or the organic silicon, and 0.1-10% of inorganic matter fine powder (such as silicon dioxide powder) which can not react with the mixture is additionally added. By adopting the method, white light LED with uniform light color can be obtained, but the problems of rise in the temperature due to continuous lighting of the blue light LED, deterioration of wavelength conversion material and insufficient light efficiency are still present.

As the transparent ceramic material of the invention, such as magnesium aluminate spinel (MA), yttrium aluminum garnet (YAG), yttrium oxide, aluminum oxynitride and the like, has a cubic structure, the transparent ceramic material can be made into transparent ceramic; furthermore, the transparent ceramic material has the characteristics of good corrosion resistance, insulativity, high heat conductivity, high melting point, high hardness and high strength, and the excellent performances of the transparent ceramic material enable a device manufactured by the transparent ceramic material to be strong in environmental suitability, wear-resistant and impact-resistant. After a long-term use, the transparent ceramic material has few surface damages and can still keep high transmission, thereby being the ideal packaging optical material. However, although aluminum oxide and other materials can also be used for manufacturing the transparent ceramic, the hexagonal crystal structure decides that the current technology can only realize semi-transparence and such materials are very difficult to be used here.

Chinese patent CN100565000C discloses a method for manufacturing a white light LED with YAG transparent ceramic. But the patent does not utilize the transparent ceramic which is formed by firing for packaging the LED and only applies a rare earth-doped YAG ceramic powder to coat the LED chip so as to avoid yellow light ring, blue light ring and other problems. The method is only different from the traditional method in that rare earth-doped YAG transparent ceramic particles are used for replacing the fluorescent powder, and the heat dissipation, the light-emitting uniformity and the like of the LED are not improved.

Chinese patent CN100389504C discloses a YAG wafer type white light LED and packaging method thereof. A YAG single wafer is utilized for converting part of blue light which is emitted by a GaN-based inorganic semiconductor LED chip to the light in another wave band or various wave bands, and then the remaining unconverted blue light emitted by the LED chip is mixed with the light in the ideal wave band after the conversion through the single wafer for generating white light. The technical problem that it is very difficult in the traditional white light LED device technology to control the dispersivity of phosphor powder in silicon grease type or resin type sealants so as to finally lead to non-uniform white light of the LED device can be solved by the uniformity of the single wafer to obtain single and high-quality white light. However, as the YAG single wafer is longer in growth cycle and high in cost and the doping of rare earth element is difficult to control, the patent is more difficult to be applied in production.

INVENTION CONTENTS

The invention aims at providing a method for manufacturing an LED with transparent ceramic, which can solve the problems of poor light-emitting uniformity and poor heat conduction of the current LED device, replaces the technology of packaging fluorescent powder layer and epoxy resin housing and other existing LED technologies, and has the advantages of high reliability in process operation and the like.

In order to realize the purpose, the invention provides a method for manufacturing the LED with the transparent ceramic, which specifically comprises the following steps:

1) adding quantitative fluorescent powder into non-fluorescent transparent ceramic powder, wherein the doped ratio of the fluorescent powder to the non-fluorescent transparent ceramic is 0.01-7 wt %, or using a fluorescent transparent ceramic power made of 100 wt % fluorescent powder;

2) preparing the fluorescent transparent ceramic using the generally known ceramic preparation processes, after fully mixing the raw material;
3) performing cutting and pretreatments on the obtained fluorescent transparent ceramic so as to process the fluorescent transparent ceramic into the required shape and size of a device;
4) assembling the processed fluorescent transparent ceramic and a semiconductor chip to form an LED device.

Further, the fluorescent powder in the step 1) includes one of yellow fluorescent powder, red fluorescent powder, green fluorescent powder, orange fluorescent powder, blue fluorescent powder and purple fluorescent powder or more of them, which are mixed according to the set proportion.

Further, the material of the transparent ceramic powder in the step 1) is one of magnesium aluminate spinel, yttrium aluminum garnet, yttrium oxide, aluminum oxynitride, zinc sulfide, zirconium oxide, yttrium lanthanum oxide, strontium chromate, magnesium oxide, beryllium oxide, yttrium oxide-zirconium dioxide, gallium arsenide, zinc sulfide, zinc selenide, magnesium fluoride, calcium fluoride, scandium oxide, lutetium oxide and gadolinium oxide.

Further, the mixing of the raw materials in the step 2) comprises wet process and dry process, and the drying treatment needs to be performed on the raw materials mixed through the wet process.

Further, the ceramic preparation processes in step 2) comprise processes such as vacuum hot-pressing, vacuum sintering, pressureless sintering, microwave sintering, SPS (Spark Plasma Sintering) or laser sintering.

Further, the ceramic preparation processes further comprise annealing and hot isostatic pressing treatment after sintering treatment.

Further, the pretreatments in the step 3) comprise coarse grinding, fine grinding and polishing.

Further, the semiconductor chip in the step 4) can be a blue light LED chip, an ultraviolet light LED chip, a green light LED chip, a red light LED chip or a yellow light LED chip, and the emitted light can be mixed into multi-color light by selecting the semiconductor chips in different light-emitting colors and the fluorescent powders in different light-emitting colors.

In the present invention, the fluorescent transparent ceramic is used to replace the fluorescent powder layer and the epoxy resin packaging housing in the traditional LED and the fluorescent transparent ceramic and the LED chip are assembled into the novel LED device, and the fluorescent transparent ceramic has double functions of the packaging housing and the fluorescent material, so that the LED device manufactured by the method of the present invention can be more excellent in performances thereof.

DETAILED DESCRIPTION

Figure 1:
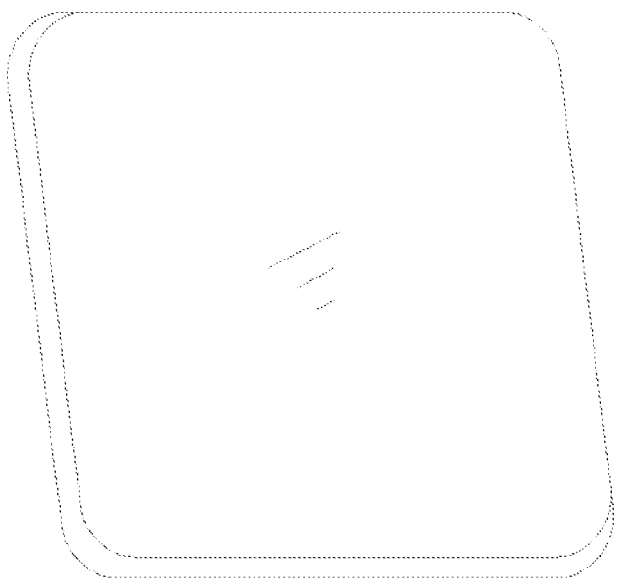
FIG. 1 is a photo of the fluorescent transparent ceramic obtained in embodiment 2.

The invention relates to a method for manufacturing an LED with transparent ceramic, an appropriate amount of fluorescent powder is firstly added to transparent ceramic powder for fully mixing, wherein the fluorescent powder includes one of yellow fluorescent powder, red fluorescent powder, green fluorescent powder, orange fluorescent powder, blue fluorescent powder and purple fluorescent powder or more of them, which are mixed according to the set proportion. The transparent ceramic powder comprises magnesium aluminate spinel, yttrium aluminum garnet, yttrium oxide, aluminum oxynitride, zinc sulfide, zirconium oxide, yttrium lanthanum oxide, strontium chromate, magnesium oxide, beryllium oxide, yttrium oxide-zirconium dioxide, gallium arsenide, zinc sulfide, zinc selenide, magnesium fluoride, calcium fluoride, scandium oxide, lutetium oxide, gadolinium oxide and the like, and the doped ratio of the fluorescent powder is 0.01-100 wt %.

After the raw materials are fully mixed, the generally known ceramic preparation processes, such as vacuum hot-pressing, vacuum sintering, pressureless sintering, microwave sintering, hot isostatic pressing, SPS (Spark Plasma Sintering) or laser sintering and the like, are adopted, and annealing and hot isostatic pressing treatment can also be performed after sintering according to the actual situation of the material so as to prepare the fluorescent transparent ceramic. The prepared fluorescent transparent ceramic and the semiconductor chip are assembled to form an LED device, thereby replacing the existing packaging process of coating the fluorescent powder to resin or glass layer.

The semi-conductor chip can be a blue light LED chip, an ultraviolet light LED chip, a green light LED chip or a red light LED chip and the like, and the emitted light can be mixed into multi-color light by selecting the semiconductor chips in different light-emitting colors and the fluorescent powders in different light-emitting colors.

Transparent ceramic material, such as MA (magnesium aluminate spinel), YAG (yttrium aluminum garnet), yttrium oxide and the like, has the characteristics of good corrosion resistance, insulativity, high heat conductivity, high melting point, high hardness, high strength and excellent light transmission, and the excellent performances enable the device made of the transparent ceramic material to be strong in environmental suitability, wear-resistant and impact-resistant; furthermore, after a long-term use, the transparent ceramic material has few surface damages and can still keep high transmission, thereby being the ideal packaging optical material.

In the invention, light emitted by the LED chip is utilized for exciting fluorescent components in the fluorescent transparent ceramic, for example, the blue light emitted by the blue light LED chip is utilized for exciting the yellow fluorescent powder in the magnesium aluminate spinel fluorescent transparent ceramic so as to enable the magnesium aluminate spinel fluorescent transparent ceramic to emit the yellow light in 550-580 nm, and the yellow light is mixed with the remaining blue light passing through the MA transparent ceramic for forming the white light.

When the doped ratio of the fluorescent powder is 100%, namely the transparent ceramic powder doped with light-emitting ions can not only be used as a light-emitting substance, but also acts as a ceramic matrix, the transparent ceramic prepared by the powder can be directly used for packaging the LED, for example, the Ce: YAG transparent ceramic and the blue light chip can be directly used for packaging the white light LED, at this time, the content of cerium ions is 0.01 at. %-30 at. %; when in use, the thickness of a ceramic body can be simultaneously regulated according to requirements.

The absorption peak and the emission peak of the fluorescent powder can be selected according to the power, the emission wavelength, the required chromaticity and color temperature and other requirements of the chip so as to obtain different emitted light.

The type of the fluorescent powder can be changed, different chips can be matched, the prepared LED is not limited to emission of the white light, and performance parameters can be regulated by regulating the proportion of the fluorescent powder, as well as the thickness and the shape (chip type, lens type and the like) of the prepared ceramic.

The fluorescent transparent ceramic are used for replacing a fluorescent powder layer and an epoxy resin packaging housing in the traditional LED, and the fluorescent transparent ceramic and the LED chip are assembled into the novel LED device. Here, the fluorescent transparent ceramic have dual identities: 1) the packaging housing; and 2) the fluorescent material. The performances of the novel LED device are more excellent and specifically represented in the following aspects:

(1) As the fluorescent conversion material:

The advantages of uniformity and good consistency are realized: the fluorescent conversion substance is uniformly distributed in the transparent ceramic, the light-emitting uniformity is fully ensured, simultaneously, color temperature and other parameters of an LED product can be effectively controlled through the accurate controlling of the doping amount of the fluorescent powder and the precise controlling of the thickness of a ceramic layer, and the consistency in the performances of the LED produce is greatly improved. The fluorescent performance of the fluorescent transparent ceramic is more excellent than that of the fluorescent powder, the uniformity is improved, and accordingly, the light-emitting performance of the LED device can be further improved.

The heat conductivity is good: the heat conductivity of the transparent ceramic is higher, the working current can be improved and the luminous intensity of the LED can be improved.

(2) As the housing:

The performances are stable and the service life is long: compared with organic materials, the transparent ceramic has high temperature resistance and chemical corrosion resistance, is less prone to aging and can improve the stability and the service life of the LED device.

The light output efficiency is high: the refractive index of the transparent ceramic is high (1.6-2.1), studies prove that when the refractive index of the packaging material is increased from 1.5 to 1.7, the light output efficiency can be improved by about 30%.

The environmental suitability is strong and the range of applications is wide: the transparent ceramic has good mechanical properties and high chemical stability, so that the device is more wear-resistant and impact-resistant, after a long-term use, there are few surface damages, high transmission is kept, the service life is long, and the transparent ceramic can be further used in many severe environments so as to greatly expand the range of the application of the LED.

The transparent ceramic described in the present invention are not only limited to the several types discussed above, and the skilled in this art would quite easily understand that other types of the transparent ceramics are also applicable to the present invention.

Embodiment 1

The preparation of a white light LED with MA (magnesium aluminate spinel) transparent ceramic is taken as the embodiment.

1) Preparation of powder: adding 2 wt % of Ce: YAG (the Ce content is 1 at %) yellow fluorescent powder to the MA transparent ceramic powder, fully mixing through the wet process by ball milling, drying the mixture and then obtaining the fluorescent transparent ceramic powder; during the preparation process of the powder, if the mixture is prepared through the dry process, the drying treatment is not required, and the fluorescent transparent ceramic powder can be obtained after fully mixing.

2) Forming process: performing vacuum hot-pressing forming on the fluorescent transparent ceramic powder added with a sintering additive so as to obtain a sintered body of the fluorescent transparent ceramic; and performing annealing treatment on the sintered body within a certain temperature range, then performing hot isostatic pressing and then performing coarse grinding, fine grinding and polishing so as to obtain the MA fluorescent transparent ceramic;

3) LED packaging: assembling the prepared MA fluorescent transparent ceramic and a blue light semiconductor chip to form an LED device.

The results of an electric light source test are as follows:
Chromaticity coordinates: x=0.346, y=0.353
Color temperature: Tc=3163K
Color rendering index: Ra=72
Light efficiency: η=66.8 lm/W Blue light emitted by the blue light LED chip is utilized for exciting the Ce: YAG fluorescent powder in the fluorescent transparent ceramic so as to enable the fluorescent transparent ceramic to emit yellow light in 550-580 nm, and the yellow light is mixed with the remaining blue light passing through the transparent ceramic for forming white light. The white light having different related color temperatures and color rendering indexes can be produced by regulating the chemical components and the doping amount of the fluorescent powder in the fluorescent transparent ceramic, as well as the thickness of a ceramic plate.

The absorption peak and the emission peak of the fluorescent powder can be selected according to the power of the chip, the emission wavelength, the required chromaticity and color temperature and other requirements so as to obtain different emitted light.

The type of the fluorescent powder can be changed, different chips can be matched and the prepared LED is not limited to emission of the white light.

The preparation process of the fluorescent transparent ceramic in the present invention is not limited to the preparation methods of hot-pressed sintering and hot isostatic pressing.

Embodiment 2

The preparation of a white light LED with MA transparent ceramic is taken as the embodiment.

1) Preparation of powder: adding 7 wt % of commercially available yellow fluorescent powder to the MA transparent ceramic powder and fully mixing so as to obtain the fluorescent transparent ceramic powder.

2) Forming process: performing vacuum hot-pressing forming on the fluorescent transparent ceramic powder added with a sintering additive so as to obtain a sintered body of the fluorescent transparent ceramic; and performing annealing treatment on the sintered body within a certain temperature range, and then performing hot isostatic pressing, cutting and polishing treatment so as to obtain the MA fluorescent transparent ceramic, shown as FIG. 1.

Figure 2:
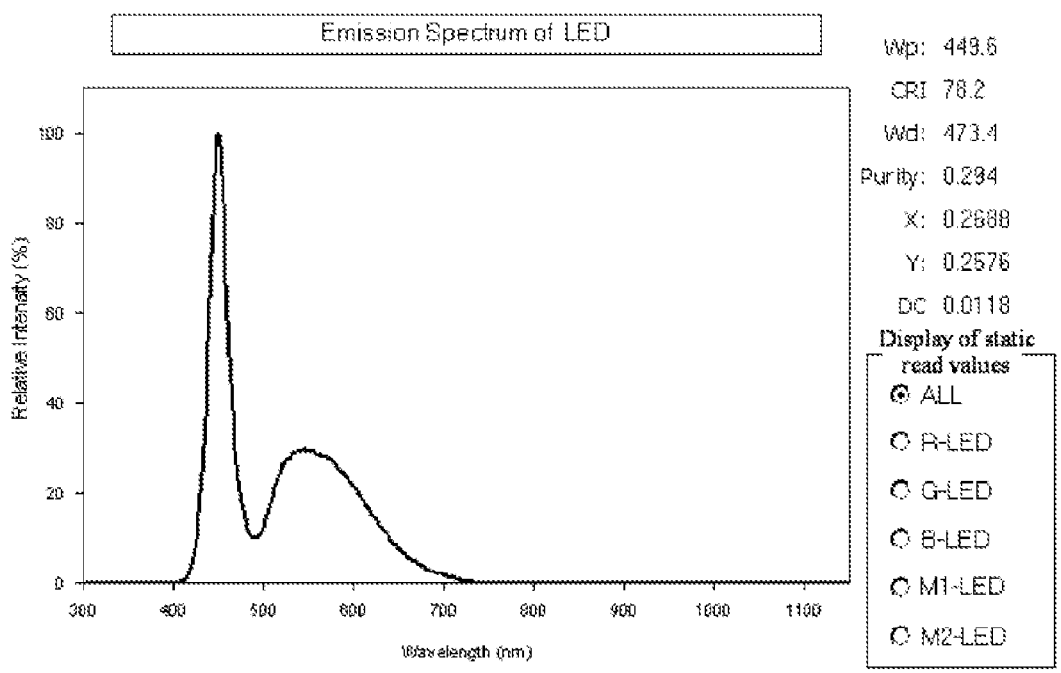
FIG. 2 is a spectrogram of the LED obtained in embodiment 2.

3) LED packaging: assembling the prepared MA fluorescent transparent ceramic and a blue light LED chip to form an LED device. The output of white light is realized. The spectrogram of the obtained LED device is shown as FIG. 2.

The results of an electric light source test are as follows:
Chromaticity coordinates: x=0.269, y=0.258
Related color temperature: Tc=7949K
Color rendering index: Ra=73.1
Light efficiency: η=60.4 lm/W Embodiment 3

The preparation of a three-wavelength white light LED with MA transparent ceramic is taken as the embodiment.

1) Preparation of powder: adding commercially available green, yellow and red fluorescent powders to the MA transparent ceramic powder according to 0.4 wt %, 2 wt % and 0.2 wt % respectively and fully mixing so as to obtain the fluorescent transparent ceramic powder.
2) Forming process: performing vacuum hot-pressing forming on the fluorescent transparent ceramic powder added with a sintering additive so as to obtain a sintered body of the fluorescent transparent ceramic; and performing annealing treatment on the sintered body within a certain temperature range, and then performing hot isostatic pressing, cutting and polishing treatment so as to obtain the MA fluorescent transparent ceramic.
3) LED packaging: assembling the prepared MA fluorescent transparent ceramic and a blue light LED chip to form an LED device.

Embodiment 4

The preparation of a red light LED with MA transparent ceramic is taken as the embodiment.
1) Preparation of powder: adding 0.5 wt % of red fluorescent powder to the MA transparent ceramic powder and fully mixing so as to obtain the fluorescent transparent ceramic powder.
2) Forming process: performing vacuum hot-pressing forming on the fluorescent transparent ceramic powder added with a sintering additive so as to obtain a sintered body of the fluorescent transparent ceramic; and then performing hot isostatic pressing, cutting and polishing treatment so as to obtain the MA fluorescent transparent ceramic.
3) LED packaging: assembling the prepared MA fluorescent transparent ceramic and an ultraviolet LED chip to form a red LED device.

Embodiment 5

The preparation of a white light LED with Ce: YAG transparent ceramic is taken as the embodiment.

The Ce: YAG transparent ceramic containing 0.1 at % of cerium element is directly used for LED packaging, and the Ce: YAG transparent ceramic and a blue light LED chip are assembled to form a white light LED device.

The results of an electric light source test are as follows:
Chromaticity coordinates: x=0.339, y=0.325
Color temperature: Tc=5179K
Color rendering index: Ra=73
Light efficiency: η=30 lm/W Embodiment 6

The preparation of a white light LED with yttrium oxide transparent ceramic is taken as the embodiment.
1) Preparation of powder: adding 3 wt % of commercially available yellow fluorescent powder to the yttrium oxide transparent ceramic powder and fully mixing so as to obtain the fluorescent transparent ceramic powder.
2) Forming process: performing vacuum hot-pressing forming on the fluorescent transparent ceramic powder added with a sintering additive so as to obtain a sintered body of the fluorescent transparent ceramic; and performing annealing treatment on the sintered body within a certain temperature range, and then performing hot isostatic pressing, cutting and polishing treatment so as to obtain the yttrium oxide fluorescent transparent ceramic.
3) LED packaging: assembling the prepared yttrium oxide fluorescent transparent ceramic and a blue light LED chip to form an LED device.

The invention claimed is:

1. A method for manufacturing an LED (light-emitting diode) with transparent ceramic, comprising the following specific steps:

1) adding quantitative fluorescent powder into non-fluorescent transparent ceramic powder, wherein a doped ratio of the fluorescent powder to the non-fluorescent transparent ceramic powder is 0.01-7 wt % or using a fluorescent transparent ceramic powder made of 100 wt % fluorescent powder;
2) fully mixing said fluorescent powder and said non-fluoresent transparent ceramic powder and preparing a fluorescent transparent ceramic or preparing a fluorescent transparent ceramic using 100 wt % fluorescent powder via ceramic preparation processes;
3) performing cutting and pretreatments on the fluorescent transparent ceramic so as to process the fluorescent transparent ceramic into a required shape and size of a device;
4) assembling the fluorescent transparent ceramic and a semiconductor chip to form an LED device; and
wherein said transparent ceramic powder in step 1) is one of magnesium aluminate spinel, yttrium aluminum garnet, yttrium oxide, aluminum oxynitride, zinc sulfide, zirconium oxide, yttrium lanthanum oxide, strontium chromate, magnesium oxide, beryllium oxide, yttrium oxide-zirconium, dioxide,gallium arsenide, zinc sulfide, zinc selenide, magnesium fluoride, calcium fluoride, scandium oxide, lutetium oxide or gadolinium oxide.

2. The method for manufacturing the LED with the transparent ceramic according to claim 1, wherein the fluorescent powder in the step 1) includes one of yellow fluorescent powder, red fluorescent powder, green fluorescent powder, orange fluorescent powder, blue fluorescent powder and purple fluorescent powder or more of them, which are mixed according to the set proportion.

3. The method for manufacturing the LED with the transparent ceramic according to claim 1, wherein the mixing of the fluorescent powder and the non-fluorescent transparent ceramic powder in the step 2) comprises a wet process and a drying process, and the drying process is performed after the fluorescent powder and non-fluorescent transparent ceramic powder are mixed through the wet process.

4. The method for manufacturing the LED with the transparent ceramic according to claim 1, wherein the ceramic preparation processes in the step 2) comprise at least one of vacuum hot-pressing, vacuum sintering, pressureless sintering, microwave sintering, SPS (Spark Plasma Sintering) or laser sintering.

5. The method for manufacturing the LED with the transparent ceramic according to claim 4, wherein the ceramic preparation processes further comprise annealing and hot isostatic pressing treatment after sintering treatment.

6. The method for manufacturing the LED with the transparent ceramic according to claim 1, wherein the pretreatments in the step 3) comprise coarse grinding, fine grinding and polishing.

7. The method for manufacturing the LED with the transparent ceramic according to claim 1, wherein the semiconductor chip in the step 4) comprises a blue light LED chip, an ultraviolet light LED chip, a green light LED chip, a red light LED chip or a yellow light LED chip.

8. The method for manufacturing the LED with the transparent ceramic according to claim 1, wherein the LED is configured to emit multi-color light by selecting semiconductor chips in different light-emitting colors and fluorescent powders in different light-emitting colors.

* * * * *